(12) United States Patent
Matsumoto

(10) Patent No.: US 6,924,656 B2
(45) Date of Patent: Aug. 2, 2005

(54) METHOD AND APPARATUS FOR TESTING BGA-TYPE SEMICONDUCTOR DEVICES

(75) Inventor: Chiaki Matsumoto, Mihama-ku (JP)

(73) Assignee: Kawasaki Microelectronics, Inc., Chiba (JP)

( * ) Notice: Subject to any disclaimer, the term of this patent is extended or adjusted under 35 U.S.C. 154(b) by 90 days.

(21) Appl. No.: 10/689,983

(22) Filed: Oct. 22, 2003

(65) Prior Publication Data

US 2004/0085060 A1 May 6, 2004

(30) Foreign Application Priority Data

Oct. 22, 2002 (JP) ........................................ 2002-306751

(51) Int. Cl.$^7$ ......................... G01R 31/02; G01R 31/28
(52) U.S. Cl. ..................................... 324/758; 324/158.1
(58) Field of Search ................................. 324/758, 754, 324/765, 158.1

(56) References Cited

U.S. PATENT DOCUMENTS

| | | | |
|---|---|---|---|
| 5,307,011 A | * | 4/1994 | Tani ........................ 324/158.1 |
| 5,625,287 A | | 4/1997 | Nakamura et al. |
| 5,801,527 A | * | 9/1998 | Ishii et al. ................ 324/158.1 |
| 5,955,888 A | | 9/1999 | Frederickson et al. |
| 6,204,676 B1 | | 3/2001 | Hsieh et al. |
| 6,476,629 B1 | * | 11/2002 | Bjork ......................... 324/765 |
| 6,566,751 B1 | | 5/2003 | Yun |

FOREIGN PATENT DOCUMENTS

| JP | A 11-97139 | 4/1999 |
|---|---|---|
| JP | A 11-287842 | 10/1999 |

* cited by examiner

Primary Examiner—Ernest Karlsen
(74) Attorney, Agent, or Firm—Oliff & Berridge, PLC

(57) ABSTRACT

A plurality of semiconductor devices is placed in pockets of a tray with terminal surfaces facing upward. Positions of bump terminals of the semiconductor devices are adjusted relative to the tray. The tray is successively moved such that the bump terminals of the semiconductor devices are successively placed at a testing position. The semiconductor devices are successively tested at the testing position by, for example, contacting test electrodes to the bump terminals.

10 Claims, 7 Drawing Sheets

METHOD AND APPARATUS FOR TESTING BGA-TYPE SEMICONDUCTOR DEVICES

BACKGROUND OF THE INVENTION

1. Field of Invention

This invention relates to a method for testing semiconductor devices having bump terminals. This invention also relates to an apparatus for testing semiconductor devices having bump terminals.

2. Description of Related Art

Ball-grid-array (BGA) type semiconductor devices, have a plurality of bump terminals arranged on their terminal surfaces. BGA-type devices have been generally tested as follows. The semiconductor devices are placed in pockets of a tray such as a customer tray. The tray is transferred to a testing apparatus. The testing apparatus has a test head. The test head has test electrodes. The bump terminals of the semiconductor devices are brought into contact with the test electrodes. Then, electrical characteristics are tested. The shape of the bump terminals, such as the height of the terminal, is also tested. Thereafter, the tested devices are grouped into categories of good ones and defective ones.

When testing electrical characteristics, the semiconductor devices are generally picked up from the tray, one by one, using a robot arm, and the picked-up device is fitted to a socket having the test electrodes of the test head.

FIGS. 1A and 1B show one example of a BGA-type semiconductor device 16. FIGS. 1A and 1B show plan views of the semiconductor device 16 from opposite directions.

A plurality of bump terminals 13 are arranged on the surface (terminal surface) 12 shown in FIG. 1B. Specifically, two rows of bump terminals 13 each having a diameter of, for example, 0.3 mm are arranged on the terminal surface 12 along the four sides at intervals of 0.5 mm in each row.

Also, as shown in FIG. 1A, the semiconductor device 16 has a mold size of, for example, 18 mm×18 mm. This size is somewhat smaller than the size of the pocket of the tray. For example, the pocket has a size of 19.3 mm×19.3 mm, and thus, the sizes of the four sides of the semiconductor device 16 are each 1.3 mm shorter than the pocket size.

One type of BGA device is called a chip-size-package (CSP) type device. CSP-type devices have recently received much attention.

FIG. 2 shows a typical example of the tolerance of the position of the outermost bump terminal 13 for a CSP-type device.

As shown in FIG. 2, the bump terminal 13 has an outer diameter of 0.3 mm±0.05 mm, while the distance between the corner of the package 15 and the center of the bump terminal 13 is X±0.2 mm, where X represents an arbitrary value depending on the type of the package. In other words, the tolerance for the distance between the corner of the package and the bump terminal 13 is larger than the tolerance for the outer diameter of the bump terminal 13.

Japanese Unexamined Patent Application Publication No. 11-287842, incorporated herein by reference in its entirety, discloses a method in which a semiconductor device is picked-up from a customer tray and transferred onto an insert of a test tray. The insert has a guide means, such as a guide hole, a guide pin, or a tapered side surface that guides the bump terminals.

Alternatively, JP 11-287842 discloses the guide means provided in a heating plate to which the semiconductor devices are transferred from the customer tray. After the heating plate heats the semiconductor devices, the devices are further transferred to a test head.

In another alternative, JP 11-287842 discloses the guide means provided in chip carriers to which the semiconductor devices are transferred from the customer tray. The chip carriers carry the semiconductor device within the test apparatus.

Japanese Unexamined Patent Application Publication No. 11-97139, incorporated herein by reference in its entirety, discloses a method to align the bump terminals with the test electrodes of a socket by vibrating and sucking the semiconductor device.

SUMMARY OF THE INVENTION

Typically, the position in which the semiconductor device is placed in each pocket of the tray varies according to the size of the pocket. Therefore, the relative positional relationship between the socket and the bump terminals deviates correspondingly. Hence, a contact failure or deformation failures of the bump terminals may occur due to, for example, irregular contacts of the bump terminals with the test electrodes.

One way to increase the position accuracy of the semiconductor device is by reducing the pocket size. However, a reduction of the pocket size makes it difficult to pick up the semiconductor device from the pocket. Even if the pocket size could be successfully reduced, another problem is expected to arise.

In the CSP-type devices the dimensional accuracy of the package mold is usually very poor. Therefore, positions of the bump terminals relative to the outer corner of the CSP-type device are not always constant. Hence, the bump terminals of a semiconductor device placed in a pocket of a tray cannot be positioned with high accuracy, even if the semiconductor device, or the package mold of the semiconductor device, is accurately placed in the pocket. Thus, in a CSP-type device, irregular contacts of the bump terminals 13 with the test electrodes are expected to occur even if the semiconductor device 16 were placed in the pocket with a high accuracy.

In the methods of JP 11-287842, it is necessary to prepare the test tray, the heating plate, or the chip carriers, having the guide means, separately from the customer tray. Further, a complicated mechanism to transfer the semiconductor devices from the customer tray to the test tray, the heating plate, or the chip carriers, is necessary.

In the method of JP 11-97139, it is necessary to prepare a socket that is provided with the sucking hole.

It is an object of this invention to provide a method and an apparatus for testing semiconductor devices that enables adjustment of positions of bump terminals without preparing a test tray or other special parts.

An exemplary embodiment according to this invention provides a method for testing semiconductor devices that includes placing a plurality of semiconductor devices in respective pockets of a tray. Each of the semiconductor devices in this exemplary embodiment has a terminal surface and a plurality of bump terminals arranged on the terminal surface, and the semiconductor devices are placed in the pockets with their terminal surfaces facing upward. Various exemplary embodiments of the method for testing semiconductor devices according to this invention further include adjusting, relative to the tray, positions of the bump terminals of the semiconductor devices, successively moving the tray such that the bump terminals of the semiconductor devices placed in the pockets of the tray are successively placed at a testing position, and successively testing the semiconductor devices at the testing position.

In various exemplary embodiments according to this invention, the positions of the bump terminals are adjusted while the semiconductor devices are placed in pockets of the tray. In other words, the adjustments of the positions of the bump terminals are made, in various exemplary embodiments, without transferring the semiconductor devices from one tray to another tray, or to other parts. After the adjustment of the positions of the bump terminals, in addition, in various exemplary embodiments, the successive movement of the tray successively places the bump terminals of the semiconductor devices at a testing position where the test is made. Therefore, contact failures of the bump terminals and deformation failures of the bump terminals caused by, for example, irregular contacts of the bump terminals with the test electrodes, are prevented in various exemplary embodiments.

Various exemplary embodiments according to this invention further provide an apparatus for testing semiconductor devices, the apparatus including a terminal-position adjusting unit for adjusting positions of bump terminals arranged on terminal surfaces of semiconductor devices. Various exemplary embodiments according to this invention further provide semiconductor devices placed in pockets of a tray with their terminal surfaces facing upward. Various exemplary embodiments according to this invention further provide a moving unit for successively moving the tray such that the bump terminals of the semiconductor devices placed in the pockets of the tray are successively placed in a testing position.

DETAILED DESCRIPTION OF PREFERRED EMBODIMENTS

This invention was first disclosed in Japanese Patent Application No. 2002-306751, which is incorporated herein by reference in its entirety.

In various exemplary embodiments of this invention, a testing apparatus has a terminal-position adjusting unit, a fixing unit, a moving unit, and a test head.

This exemplary testing apparatus receives a plurality of semiconductor devices placed in respective pockets of a tray with their respective terminal surfaces facing upward. In various exemplary embodiments of this invention, the terminal-position adjusting unit adjusts positions of bump terminals on the semiconductor devices. In various exemplary embodiments of this invention, when the adjustment is completed, the fixing unit detachably fixes the semiconductor devices to the tray. Then, in various exemplary embodiments of this invention, the moving unit moves the tray such that the bump terminals of the semiconductor devices in the tray are successively positioned at a predetermined testing position. During the successive movement of the tray, in various exemplary embodiments of this invention, the test head having a plurality of test electrodes moves from a retracted position to a contacting position so that the test electrodes contact the bump terminals positioned at the testing position. Thereby, in various exemplary embodiments of this invention, electrical characteristics of the semiconductor devices are tested.

Figure 3:
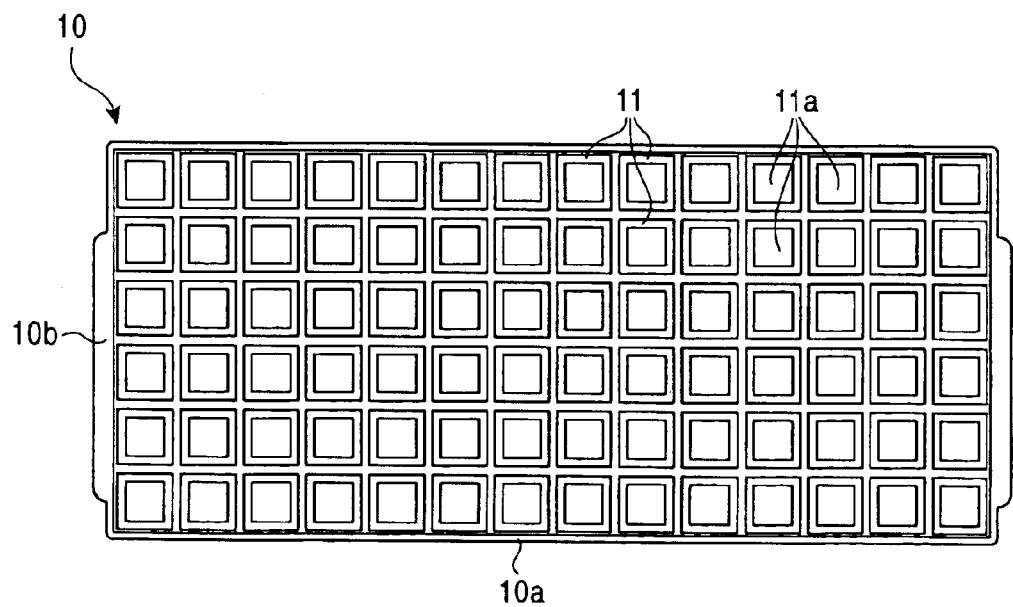
FIG. 3 shows an example of a tray used in various exemplary embodiments according to this invention.

FIG. 3 shows an example of a tray in various exemplary embodiments of this invention.

The exemplary tray 10 has long sides 10a and short sides 10b. Pockets 11 each having a size of, for example, 19.3 mm×19.3 mm are formed in the tray 10 such that fourteen pockets are arranged along the long sides 10a and six pockets are arranged along the short sides 10b. Thus, the tray 10 is able to accommodate a total of eighty-four semiconductor devices in this exemplary embodiment of the invention.

In various exemplary embodiments, an opening 11a, smaller than a typical size of a semiconductor device, is formed at the bottom of each pocket 11.

In various exemplary embodiments, the tray 10 is used in the testing apparatus in order to carry semiconductor devices between deferent units within the testing apparatus. The same exemplary tray 10 may also be used as a customer tray by which the semiconductor devices are transferred from the preceding step to the testing apparatus, or from the testing apparatus to the next step.

Figure 4:
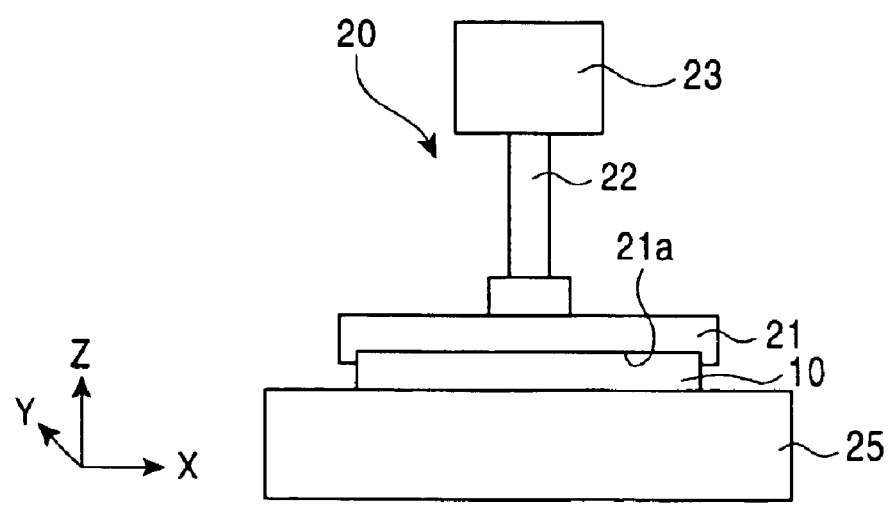
FIG. 4 is a schematic view showing a terminal-position adjusting unit of a testing apparatus according to various exemplary embodiments of this invention.
Figure 5:
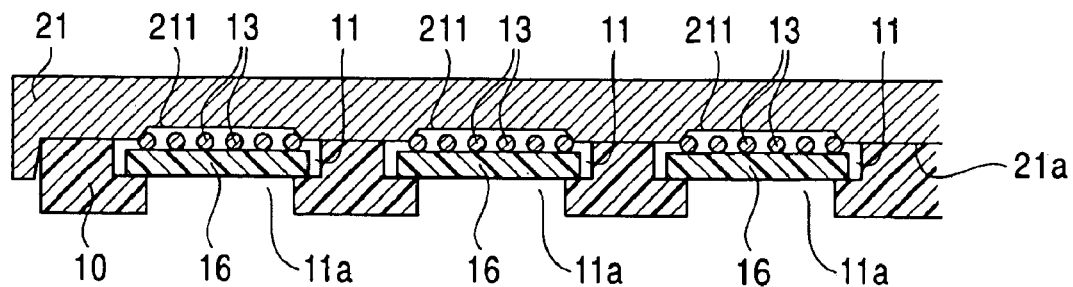
FIG. 5 is a detailed schematic view showing a terminal-position adjusting unit of a testing apparatus according to various exemplary embodiments of this invention.

FIGS. 4 and 5 are schematic views showing the terminal-position adjusting unit 20 of the testing apparatus according to various exemplary embodiments of this invention. FIG. 4 is an overall view of an exemplary terminal-position adjusting unit 20, and FIG. 5 is a partial view showing an exemplary state in which a terminal-position adjusting jig 21 of the terminal-position adjusting unit 20 is pressed against a tray 10 in various exemplary embodiments of this invention.

In various exemplary embodiments, the terminal-position adjusting unit 20 includes an XY-stage 25, on which a tray 10 is placed. The XY-stage 25 moves in X- and Y-directions and includes a built-in vibrator (not shown). Therefore, the XY-stage 25 is able to move and vibrate the semiconductor devices 16 through the tray 10.

The terminal-position adjusting unit 20, according to various exemplary embodiments of this invention, also includes a terminal position adjusting jig 21 and a driving unit 23 provided with a robot arm 22. In this exemplary embodiment, the driving unit 23 moves the jig 21 between an engagement position in which the jig 21 is pressed against the bump terminals 13 of the semiconductor devices 16 placed on the tray 10, and a retracted position in which the jig 21 is positioned away from the semiconductor devices 16. In this exemplary embodiment, the driving unit 23 includes a built-in vibrator (not shown) and is able to vibrate the jig 21.

As shown in FIG. 5, in various exemplary embodiments of this invention the semiconductor devices 16 are placed in respective pockets 11 of the tray 10 with their terminal surfaces, on which the plurality of bump terminals 13 are arranged, facing upward. In various exemplary embodiments of this invention the terminal-position adjusting jig 21 has an adjusting surface 21a including recesses 211. In various exemplary embodiments, the adjusting surface 21a faces the tray 10 placed on the XY-stage 25.

In various exemplary embodiments of this invention, the pockets 11 of the tray 10 have openings 11a at their bottoms. In these embodiments, the size of the opening 11a is smaller than the semiconductor device 16 to be placed in the pocket 11. The opening 11a is used to fix the semiconductor devices 16 after the adjustment of the positions of the bump terminals 13.

In various exemplary embodiments of this invention, when the tray 10 is transferred by a transferring mechanism (not shown) and placed onto the XY-stage 25, the robot arm 22 presses the terminal-position adjusting jig 21 against the tray 10 on which the semiconductor devices 16 are placed. Thereby, the adjusting surface 21a engages with the bump terminals 13 of the semiconductor devices 16 placed on the tray 10 in various exemplary embodiments.

In addition, in various exemplary embodiments of this invention the vibrators in the XY-stage 25 and in the driving unit 23 vibrate the tray 10 and the terminal-position adjusting jig 21. As a result, in various exemplary embodiments, the semiconductor devices 16 move within the pockets 11 of the tray 10, and the positions of the bump terminals 13 of the semiconductor devices 16 are adjusted along the recesses 211 in the adjusting surface 21a of the jig 21.

Figure 1A:
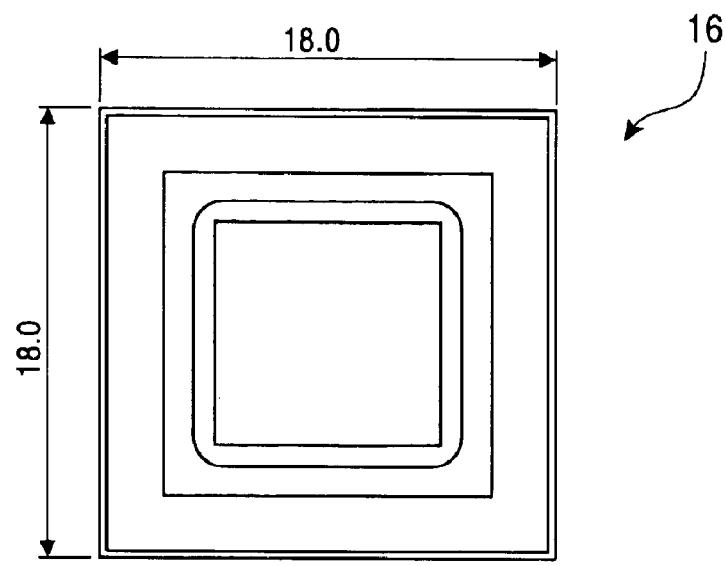
FIGS. 1A and 1B show an example of a BGA-type semiconductor device.
Figure 1B:
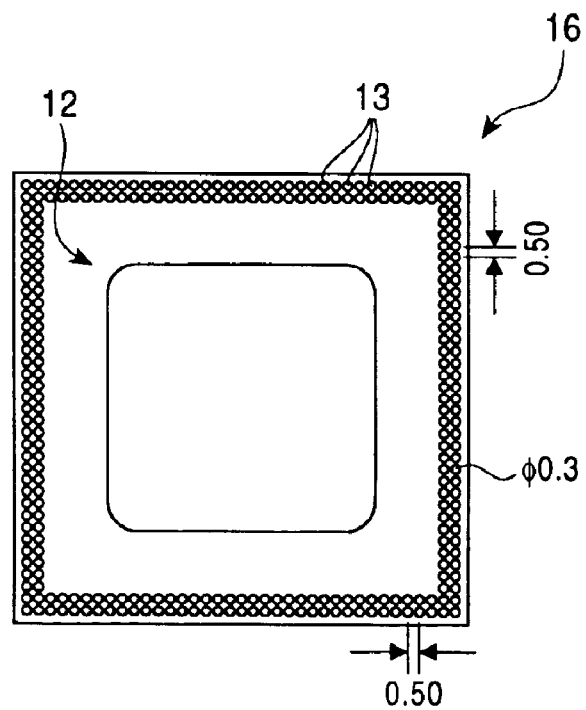
Figure 2:
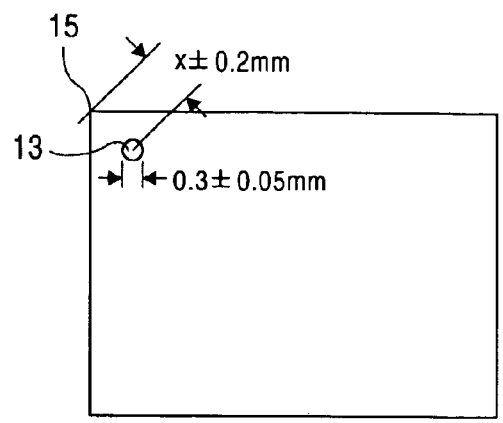
FIG. 2 shows an example of a tolerance between a mold corner and a bump terminal position at an outermost periphery in a CSP-type semiconductor device.

In various exemplary embodiments of this invention, positions of the bump terminals 13 are adjusted by a direct engagement with the adjusting surface 21a of the jig 21. Therefore, in various exemplary embodiments an improved accuracy of the adjustment is obtained even if the tolerance for the distance between the mold corner 15 and the bump terminal 13 (see FIG. 2) is large, such as where it is larger than the diameter of the bump terminal 13.

In various exemplary embodiments of this invention, the recesses 211 of the jig 21 are made so that the bump terminals 13 of each of the semiconductor devices 16 are aligned with the test electrodes when the semiconductor device is moved to the testing position by the moving unit.

In the exemplary embodiment shown in FIG. 5, the adjusting surface 21a of the jig 21 is shown as having recesses 211 with tapered sidewalls that engage with outer sides of the outermost bump terminals 13 of the semiconductor devices 16. However, in various other exemplary embodiments of this invention, the shape of the adjusting surface 21a is modified in other ways. For example, in various exemplary embodiments of this invention, the recess 211 is formed in a conical or pyramid shape that engages with each of the outermost bump terminals 13. In various other exemplary embodiments, the recess 211 is formed in a linear shape that engages with a row of the outermost bump terminals 13. Further, in various exemplary embodiments of this invention, guide pins that engage with gaps between adjacent ones of the bump terminals 13 are provided in a recess that receives all of the bump terminals 13 of each of the semiconductor devices 16 on the tray 10.

In various exemplary embodiments of this invention, the vibrators are built in both of the driving unit 23 and the XY-stage 25. However, in various other exemplary embodiments of this invention, the vibrator is built in only one of those two components. Further, depending on the design of the recesses 211 of the adjusting surface 21a, in various exemplary embodiments of this invention, the vibrator is omitted.

In various exemplary embodiments of this invention, the tray 10 is subsequently transferred to a fixing unit 30 (see FIG. 6). At this moment, in various exemplary embodiments of this invention, to avoid the semiconductor devices 16 from shifting from the adjusted positions, the tray 10 is moved while it is gripped integrally with the terminal-position adjusting jig 21 by using fixing jigs 31.

Figure 6:
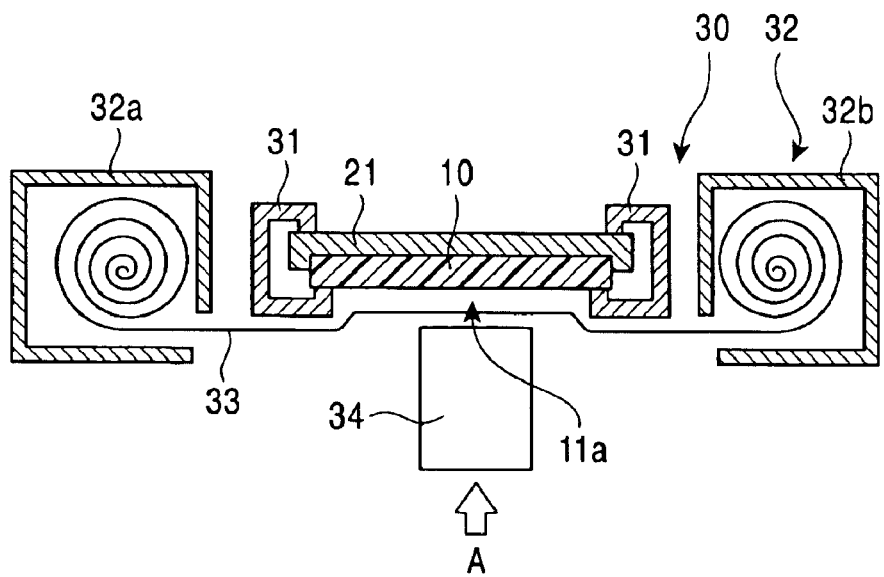
FIG. 6 is a schematic view showing a fixing unit of a testing apparatus according to various exemplary embodiments of this invention.

FIG. 6 is a schematic view showing the fixing unit 30 for detachably fixing the semiconductor devices 16 to the tray 10 in an exemplary embodiment of this invention.

In various exemplary embodiments of the invention, the fixing unit 30 includes a fixing mechanism 32 made up of a reel-out unit 32a for delivering an adhesive tape 33 and a reel-in unit 32b for withdrawing the adhesive tape, and an adhesive tape cutter (not shown).

In various exemplary embodiments of this invention, the fixing unit 30 further includes a pusher 34 for pushing the adhesive tape 33, as indicated by the arrow A, toward the tray 10. In various exemplary embodiments of this invention, the adhesive tape 33 is pushed into the openings 11a at the bottom of the tray 10 to such an extent that it attaches to respective bottom surfaces, the surfaces opposite to the terminal surfaces, of the semiconductor devices 16 (see FIG. 5). Simultaneously, in various exemplary embodiments of this invention, the adhesive tape 33 also attaches to the bottom surface of the tray 10. Thereby, in various exemplary embodiments, the semiconductor devices 16 are fixed to the tray 10. Then, in various exemplary embodiments, the adhesive tape cutter (not shown) cuts unnecessary portions of the adhesive tape 33.

In this manner, each of the semiconductor devices 16 placed on the tray 10 is fixed to the tray 10 in various exemplary embodiments. Thus, even when the tray 10 is subsequently subjected to vibration, for example, the properly adjusted positions of the bump terminals 13 are maintained.

Figure 7:
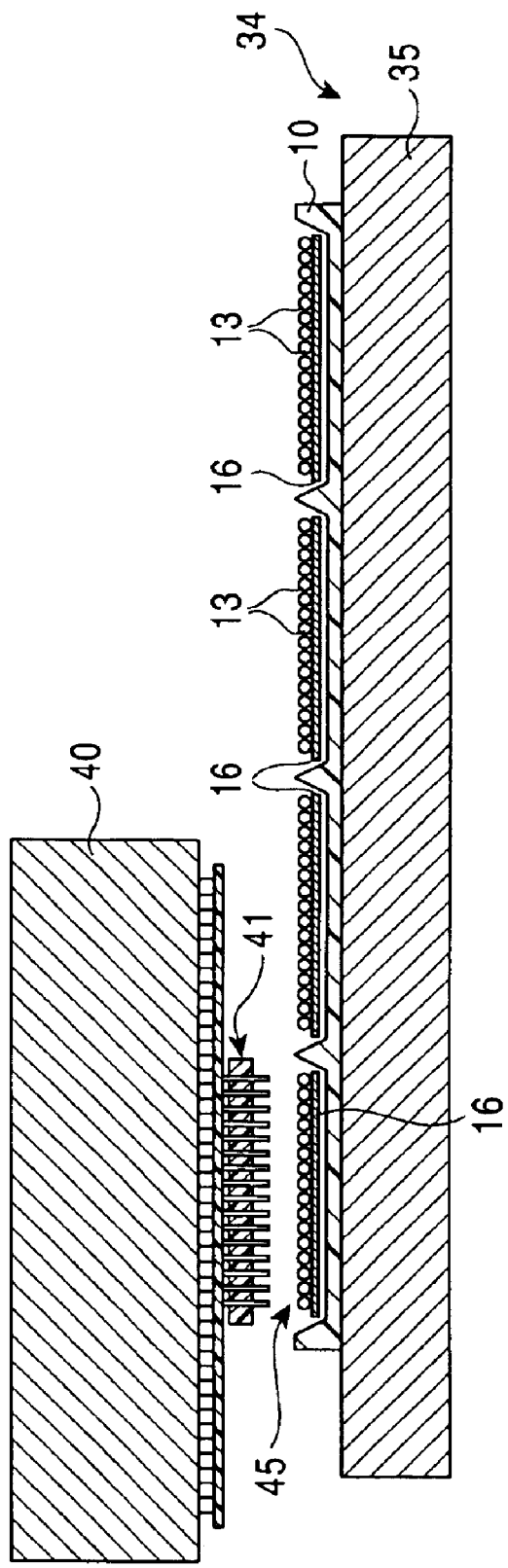
FIG. 7 is a schematic view showing a moving stage and a test head of a testing apparatus according to various exemplary embodiments of this invention.

FIG. 7 is a schematic view showing a moving unit 34 and a test head 40 of the testing apparatus according to various exemplary embodiments of this invention.

In various exemplary embodiments, the testing apparatus includes a moving stage 35 that constitutes the moving unit 34. The moving stage 35 is movable in the X- and Y-directions. In various exemplary embodiments the tray 10, on which the semiconductor devices 16 are placed, is placed on the moving stage 35. By the movement of the moving stage 35, one of the semiconductor devices 16 comes into a testing position 45 in various exemplary embodiments.

In various exemplary embodiments, there is also provided at the testing position 45 a test head 40 having a plurality of test electrodes 41. In various exemplary embodiments, the test electrodes 41 move vertically between a contacting position in which the test electrodes 41 contact the bump terminals 13 of the semiconductor device 16 placed at the testing position 45, and a retracted position in which the electrodes 41 are positioned away from the bump terminals 13.

In various exemplary embodiments, when a first one of the semiconductor devices 16 is placed at the testing position 45 by the movement of the moving stage 35, the test head 40 moves downward toward the contacting position 45 and the test electrodes 41 contact the bump terminals 13. Then, a test for electrical characteristics of the first one of the semiconductor devices 16 is made.

Upon completion of the test of the first one of the semiconductor devices 16 on the tray 10, in the testing apparatus according to various exemplary embodiments of this invention, the test head 40 moves upward to the retracted position. Then, in various exemplary embodiments, the moving stage 35 makes an incremental movement such that the next one of the semiconductor devices 16 on the tray is placed at the testing position 45. Then, in various exemplary embodiments, the test head 40 moves downward again toward the contacting position to test the next one of the semiconductor devices 16.

In the testing apparatus according to various exemplary embodiments of this invention, the test is repeated in a similar manner for all of the semiconductor devices 16 on the tray 10. That is, in various exemplary embodiments, the moving stage 35 successively moves the tray 10 so that the semiconductor devices 16 on the tray 10 are successively placed at the testing position 45. In addition, in the testing apparatus according to various exemplary embodiments of this invention, during or synchronously with the successive movement of the tray 10, the testing electrodes 41 move downward to contact the bump terminals 13 of one of the semiconductor devices 16 placed at the testing position 45. Thereby, in various exemplary embodiments, the semiconductor devices 16 on the tray 10 are successively tested at the testing position.

In the testing apparatus according to various exemplary embodiments of this invention, the test head 40 is provided with test electrodes 41 minimally sufficient to test one semiconductor device. In various exemplary embodiments, the semiconductor devices 16 are tested one at a time. Alternatively, in the testing apparatus according to various exemplary embodiments of this invention, the test head 40 is provided with test electrodes 41 capable of testing two or more semiconductor devices simultaneously. In various exemplary embodiments, two or more of the semiconductor devices 16 are tested per each incremental movement of the moving stage 35.

Figure 8:
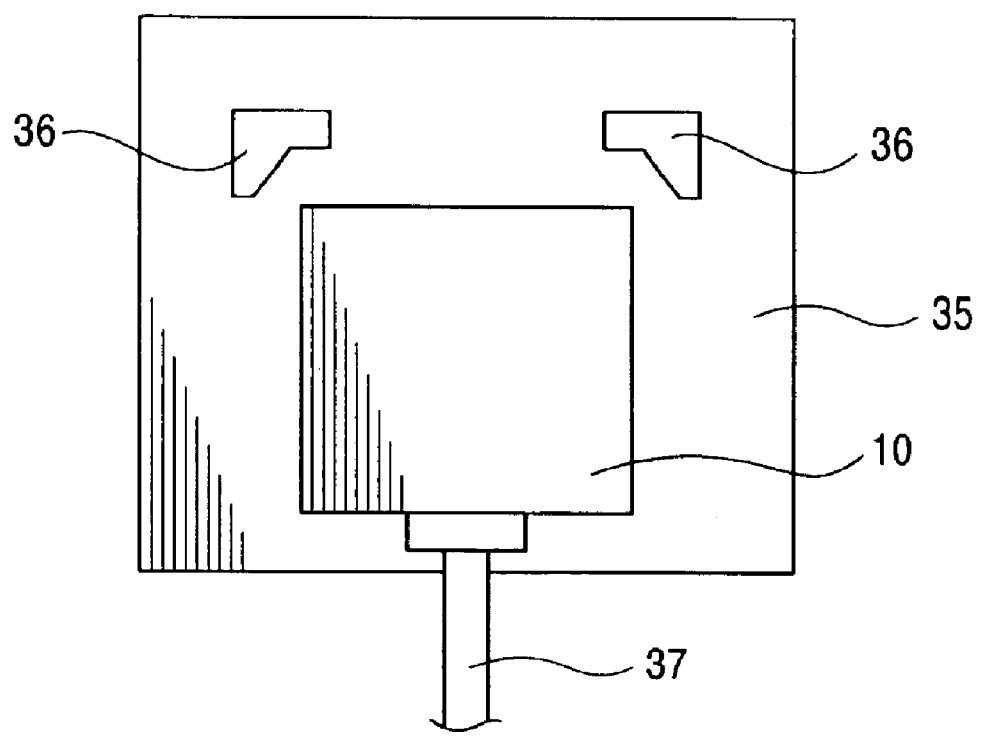
FIG. 8 is a schematic view depicting a manner of positioning a tray placed on a moving stage according to various exemplary embodiments of this invention.

FIG. 8 is a schematic view depicting a manner of positioning the tray 10 on the moving stage 35 in the testing apparatus according to various exemplary embodiments of this invention.

In various exemplary embodiments, the moving stage 35 includes a push arm 37 for pushing the tray 10 placed on the moving stage 35, and positioning guides 36. By pushing the tray 10 with the push arm 37 so the tray 10 abuts against the positioning guides 36, in various exemplary embodiments the tray 10 is placed at a predetermined position on the moving stage 35.

Thus, in various exemplary embodiments, in addition to the fact that the positions of the bump terminals 13 of the semiconductor devices 16 are adjusted relative to the tray 10 by the terminal-position adjusting unit 20, the position of the tray 10 is adjusted relative to the stage 35. Therefore, in various exemplary embodiments, by successively moving the stage 35 to predetermined positions, the bump terminals 13 of the semiconductor devices 16 are successively and accurately placed at the testing position. Thus, in various exemplary embodiments, when contacting the test electrodes 41 to the bump terminals 13 positioned at the testing position 45, the electrodes accurately align with the bump terminals 13.

These and other various exemplary embodiments of this invention prevent contact failures between the bump terminals 13 and the test electrodes 41. Deformation failures of the bump terminals 13 caused by, for example, irregular contacts of the test electrodes 41 with the bump terminals 13, are also prevented in these and other various exemplary embodiments of this invention.

Although not shown in FIG. 4, the XY-stage 25 of the fixing unit 20 of the testing apparatus according to various exemplary embodiments of this invention has structures such as that shown in the exemplary embodiment of FIG. 8 in order to adjust the position of the tray 10.

In various exemplary embodiments, the semiconductor devices 16 are fixed to the tray 10 in the fixing unit 30 by an adhesive tape. However, fixing of the semiconductor devices 16 is made by various other methods, such as vacuum chucking, in various other exemplary embodiments of this invention. Further, in various exemplary embodiments, the terminal-position adjusting unit 20, fixing unit 30, and the moving unit 34 are constructed separately. However, all or some of these units are constructed integrally in various other exemplary embodiments of this invention.

Figure 9:
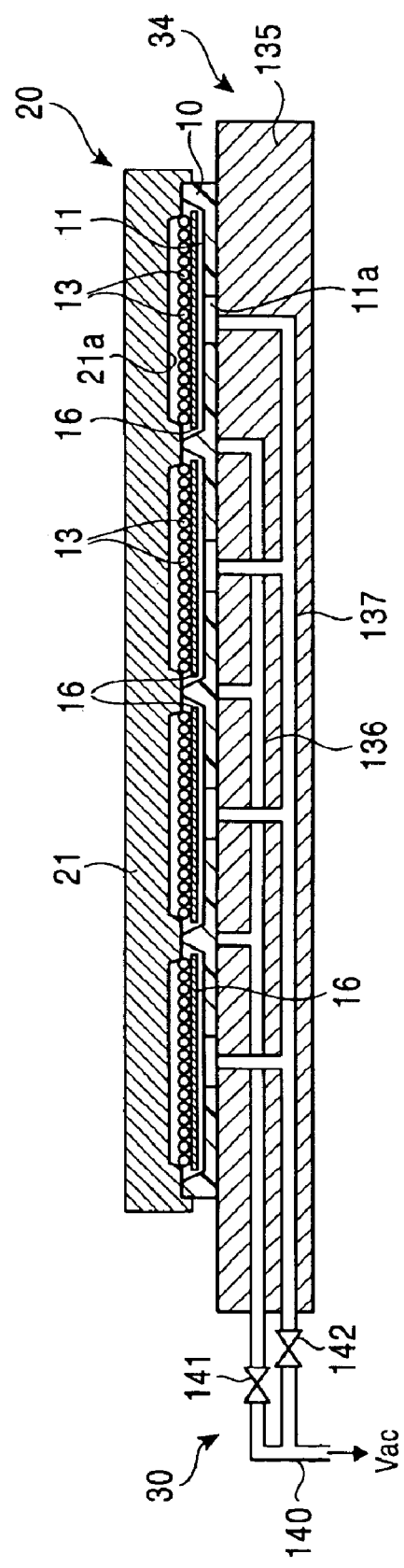
FIG. 9 is a schematic view showing another example of a testing apparatus according to various exemplary embodiments of this invention.

Another exemplary embodiment of the test apparatus of this invention is schematically shown in FIG. 9. In this and other various exemplary embodiments, the adjusting unit 20 and fixing unit 30 are integrally constructed with the moving unit 34.

In various exemplary embodiments of this invention, a moving stage 135 that constitutes the moving unit 34 has a first channel 136 and a second channel 137. In various exemplary embodiments of this invention, these channels are separately connected to a vacuum line 140 via a first valve 141 and a second valve 142, respectively.

In various exemplary embodiments of this invention, openings of the second channel 137 on the upper surface of the moving stage 135 are aligned with the openings 11a in the pockets 11 of the tray 10. In various exemplary embodiments, by opening the second valve 142, the semiconductor devices 16 in the pockets 11 of the tray 10 are vacuum-chucked via the second channel 137. In various exemplary embodiments, openings of the first channel 136 are positioned underneath the tray 10, and are not aligned with the openings 11a of the tray 10. Thus, in various exemplary embodiments, by opening the first valve 141, the tray 10 is vacuum-chucked via the first channel 136, without chucking the semiconductor devices 16 on the tray 10.

Although not shown in FIG. 9, in various exemplary embodiments of this invention, the moving stage 135 also has a mechanism to place the tray 10 at a predetermined position such as, for example, shown in the exemplary embodiment of FIG. 8.

In various exemplary embodiments of this invention, when a tray 10 transferred by a transferring mechanism (not shown) is placed on the moving stage 135, the first valve 141 opens and the tray 10 is chucked via the first channel 136 on the moving stage 135. At this moment, however, in various exemplary embodiments, the second valve 142 is still closed and, therefore, the semiconductor devices 16 are still movable in the packets 11.

Next, in various exemplary embodiments of this invention, the terminal-position adjusting jig 21 is pressed against the tray 10 to make the adjusting surface 21a of the jig 21 engage with the bump terminals 13 of the semiconductor devices 16. Thereby, in various exemplary embodiments, positions of the bump terminals 13 are adjusted.

After the positions of the bump terminals 13 are adjusted, in various exemplary embodiments of this invention, the second valve 142 is opened and the semiconductor devices 16 are vacuum chucked via the second channel 137 and are fixed to the tray 10. Then, in various exemplary embodiments, the moving stage 135 moves the tray 10 so that the first one of the semiconductor devices 16 comes into the testing position (not shown).

In various exemplary embodiments, by using the test head 40, the electrical characteristics of the semiconductor devices 16 are tested after the adjustment of the positions of the bump terminals 13. It should be apparent that the adjustment of the positions of the bump terminals 13 of the semiconductor devices placed in pockets of the tray with their terminal surfaces facing upward, is applicable to any of a number of different kinds of tests beyond the exemplary test specifically described above. For example, shapes, such as sizes and heights, of the bump terminals 13 of semiconductor devices 16 are tested efficiently and accurately by adjusting positions of the bump terminals 13 of the semiconductor devices 16 placed in the pockets 11 of the tray 10 in various exemplary embodiments of this invention.

In various exemplary embodiments of this invention, shapes of the bump terminals 13 are tested with the aid of light illuminated to, and reflected from, the bump terminals 13. In various exemplary embodiments, by adjusting the positions of the bump terminals 13 of the semiconductor devices 16 relative to the tray 10, the bump terminals 13 of semiconductor devices 16 are readily and accurately positioned at the testing position by successively moving the moving stage 35 to predetermined positions. In addition, in various exemplary embodiments of this invention, optical measurements of the shapes of the bump terminals are made with an increased accuracy.

While some of the above-described embodiments include the fixing unit 30, depending on test items, or the construction of the testing apparatus, the fixing unit is omitted in various other embodiments. For example, when the adjusting of the positions of the bump terminals is made on the moving stage 135 as shown in FIG. 9, the tray is moved to the testing position without a significant vibration in various exemplary embodiments. Therefore, it is possible to move the tray keeping the properly adjusted positions of the bump terminals 13 even if the fixing of the semiconductor devices 16 to the tray is not made in various exemplary embodiments.

According to the semiconductor device testing method and apparatus of this invention, as described above, the positions of the bump terminals of the semiconductor devices placed on the tray are adjusted, and the bump terminals are properly aligned with the test electrodes. As a result, contact failures of the bump terminals and deformation failures of the bump terminals caused by, for example, irregular contacts of the bump terminals with the test electrodes, are prevented with improved certainty.

What is claimed is:

1. A method for testing semiconductor devices, comprising:
   placing a plurality of semiconductor devices in respective pockets of a tray, each of the semiconductor devices having a terminal surface and a plurality of bump terminals arranged on the terminal surface, the semiconductor devices being placed in the pockets with their respective terminal surfaces facing upward;
   adjusting, relative to the tray, positions of the bump terminals of the semiconductor devices;
   successively moving said tray such that the bump terminals of the semiconductor devices placed in the pockets of the tray are successively placed at a testing position; and
   successively testing the semiconductor devices at the testing position.

2. The method according to claim 1, further comprising, after the adjusting, detachably fixing the semiconductor devices to the tray, and then moving the tray.

3. The method according to claim 1, wherein the successively testing comprises providing a test head having test electrodes at the testing position, and successively contacting the test electrodes to the bump terminals of the semiconductor devices placed at the testing position.

4. The method according to claim 1, wherein the successively testing comprises successively testing shapes of the bump terminals of the semiconductor devices placed at the testing position.

5. The method according to claim 1, wherein the adjusting includes:
   providing a terminal-position adjusting jig having an adjusting surface; and
   pressing the terminal-position adjusting jig against the bump terminals of the semiconductor devices placed in the pockets of the tray so that the adjusting surface engages with the bump terminals of the semiconductor devices.

6. The method according to claim 5, wherein the adjusting further includes vibrating at least one of the terminal-position adjusting jig and the tray while pressing the terminal-position adjusting jig against the bump terminals.

7. An apparatus for testing semiconductor devices, comprising:
   a terminal-position adjusting unit for adjusting positions of bump terminals arranged on terminal surfaces of semiconductor devices, the semiconductor devices being placed in pockets of a tray with their respective terminal surfaces facing upward; and
   a moving unit for successively moving the tray such that the bump terminals of the semiconductor devices placed in the pockets of the tray are successively placed in a testing position.

8. The apparatus according to claim 7, further comprising a fixing unit for detachably fixing the semiconductor devices to the tray.

9. The apparatus according to claim 7, wherein the terminal-position adjusting unit comprises a driving unit for pressing a terminal-position adjusting jig, having an adjusting surface, against the bump terminals of the semiconductor devices placed in the pockets of the tray so that the adjusting surface engages with the bump terminals.

10. The apparatus according to claim 8, wherein:
   the tray has openings at bottoms of the pockets, and
   the fixing unit fixes the semiconductor devices by attaching an adhesive tape to the semiconductor devices through the openings.

* * * * *